United States Patent
Ecker et al.

(10) Patent No.: US 9,912,309 B1
(45) Date of Patent: Mar. 6, 2018

(54) FILTER-LESS CHOPPING FOR OFFSET CANCELLATION

(71) Applicant: Marvell Israel (M.I.S.L.) Ltd., Yokneam (IL)

(72) Inventors: Reuven Ecker, Haifa (IL); Shimon Avitan, Tal-El (IL)

(73) Assignee: MARVELL ISRAEL (M.I.S.L.) LTD., Yokneam (IL)

( * ) Notice: Subject to any disclaimer, the term of this patent is extended or adjusted under 35 U.S.C. 154(b) by 0 days.

(21) Appl. No.: 15/165,809

(22) Filed: May 26, 2016

Related U.S. Application Data

(60) Provisional application No. 62/166,867, filed on May 27, 2015.

(51) Int. Cl.
  *H03F 1/02* (2006.01)
  *H03F 3/393* (2006.01)
  *H03F 1/34* (2006.01)
  *H03F 3/45* (2006.01)

(52) U.S. Cl.
  CPC .............. *H03F 3/393* (2013.01); *H03F 1/34* (2013.01); *H03F 3/45179* (2013.01); *H03F 2200/271* (2013.01); *H03F 2200/384* (2013.01); *H03F 2203/45212* (2013.01)

(58) Field of Classification Search
  CPC .............. H03F 1/02; H03F 3/45; H03F 3/387
  USPC ..................... 330/9; 327/124, 307
  See application file for complete search history.

(56) References Cited

U.S. PATENT DOCUMENTS

| | | | | |
|---|---|---|---|---|
| 6,459,335 B1 * | 10/2002 | Darmawaskita | .... | H03F 3/45977 327/124 |
| 7,218,171 B1 * | 5/2007 | Nordeng | ................. | H03F 1/304 330/9 |
| 7,795,960 B2 * | 9/2010 | Lyden | ..................... | H03F 3/387 330/9 |

\* cited by examiner

*Primary Examiner* — Steven J Mottola

(57) ABSTRACT

Aspects of the disclosure provide an amplifier system and a method for dynamically cancelling an offset voltage. The amplifier system includes a chopper amplifier system that includes a differential amplifier with an offset calibration circuit. The chopper amplifier system is configured to generate an output signal including voltage variations indicating an offset voltage of the differential amplifier. The amplifier system also includes a feedback circuit configured to determine a polarity of the offset voltage of the differential amplifier based on the output signal, and to transmit a control signal to the offset calibration circuit to reduce the offset voltage of the differential amplifier.

16 Claims, 8 Drawing Sheets

FILTER-LESS CHOPPING FOR OFFSET CANCELLATION

INCORPORATION BY REFERENCE

This present disclosure claims the benefit of U.S. Provisional Application No. 62/166,867, "Filter-less Chopping for Offset Cancellation" filed on May 27, 2015, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Mismatches of devices due to uncertainties in the manufacturing process as well as changes of supply voltage or temperature can introduce an offset voltage that reduces the performance of a system or integrated circuits. Dynamic offset cancellation techniques, such as chopping, have been developed to reduce the offset voltage during the operation of a system or integrated circuits. Chopping is a frequency modulation technique in which the signal and offset are modulated to different frequencies, and the offset can be filtered out thereafter using a filter. However, implementation of a filter may increase the output resistance of the system or circuits, which can cause difficulty for maintaining voltage accuracy in a voltage reference circuit.

SUMMARY

Aspects of the disclosure provide an amplifier system capable of dynamically cancelling an offset voltage. The amplifier system includes a chopper amplifier system that includes a differential amplifier with an offset calibration circuit. The chopper amplifier system is configured to generate an output signal including voltage variations indicating an offset voltage of the differential amplifier. The amplifier system also includes a feedback circuit configured to determine a polarity of the offset voltage of the differential amplifier based on the output signal, and to transmit a control signal to the offset calibration circuit to reduce the offset voltage of the differential amplifier.

In one embodiment, the chopper amplifier system includes a modulator configured to modulate an input signal to generate a modulated signal that is amplified by the differential amplifier to generate an amplified signal including an amplified offset voltage corresponding to the offset voltage of the differential amplifier, and a demodulator configured to demodulate the amplified signal to generate the output signal including the voltage variations.

In one embodiment, the offset calibration circuit includes a first group of calibration transistors each arranged parallel to a first input transistor of a differential pair in the differential amplifier, and a second group of calibration transistors each arranged parallel to a second input transistor of the differential pair in the differential amplifier. Each calibration transistor is serially connected with a switch controlled by one of the control signal of the feedback circuit, and ones of the calibration transistors allow an additional current at one side of the differential pair when the corresponding switch is turned on by the control signal. In an example, width length ratios (W/L) of the calibration transistors in each group have equal values or binary weighted values.

In one embodiment, the feedback circuit includes a control logic circuit configured to generate the control signal to control the offset calibration circuit and to compensate for the offset voltage of the differential amplifier. In an example, the control logic circuit is configured to generate the control signal to adjust a current at one side of the differential pair in the differential amplifier according to the polarity of the offset voltage. In another example, the control logic circuit is configured to generate the control signal to control the offset calibration circuit to adjust a current at one side of the differential pair in the differential amplifier according to the polarity of the offset voltage to compensate for the offset voltage of the differential amplifier until the polarity of the offset voltage is reversed.

In one embodiment, the feedback circuit includes a sensing circuit configured to sample the output signal and to generate a signal indicating the polarity of the offset voltage of the differential amplifier. In an example, the sensing circuit includes a first sample and hold circuit configured to sample the output signal during a first phase of a clock signal and to generate a first voltage, and a second sample and hold circuit configure to sample the output signal during a second phase of the clock signal and to generate a second voltage. The clock signal is used for a modulation and demodulation in the chopper amplifier system. In an example, the sensing circuit further includes a comparator configured to compare the first voltage and the second voltage and to generate the signal indicating the polarity of an offset voltage of the differential amplifier.

Aspects of the disclosure further provide a method for cancelling an offset voltage. The method includes generating an output signal including voltage variations indicating the offset voltage of the differential amplifier, determining a polarity of the offset voltage of the differential amplifier based on the output signal, and transmitting a control signal to an offset calibration circuit to reduce the offset voltage of the differential amplifier.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
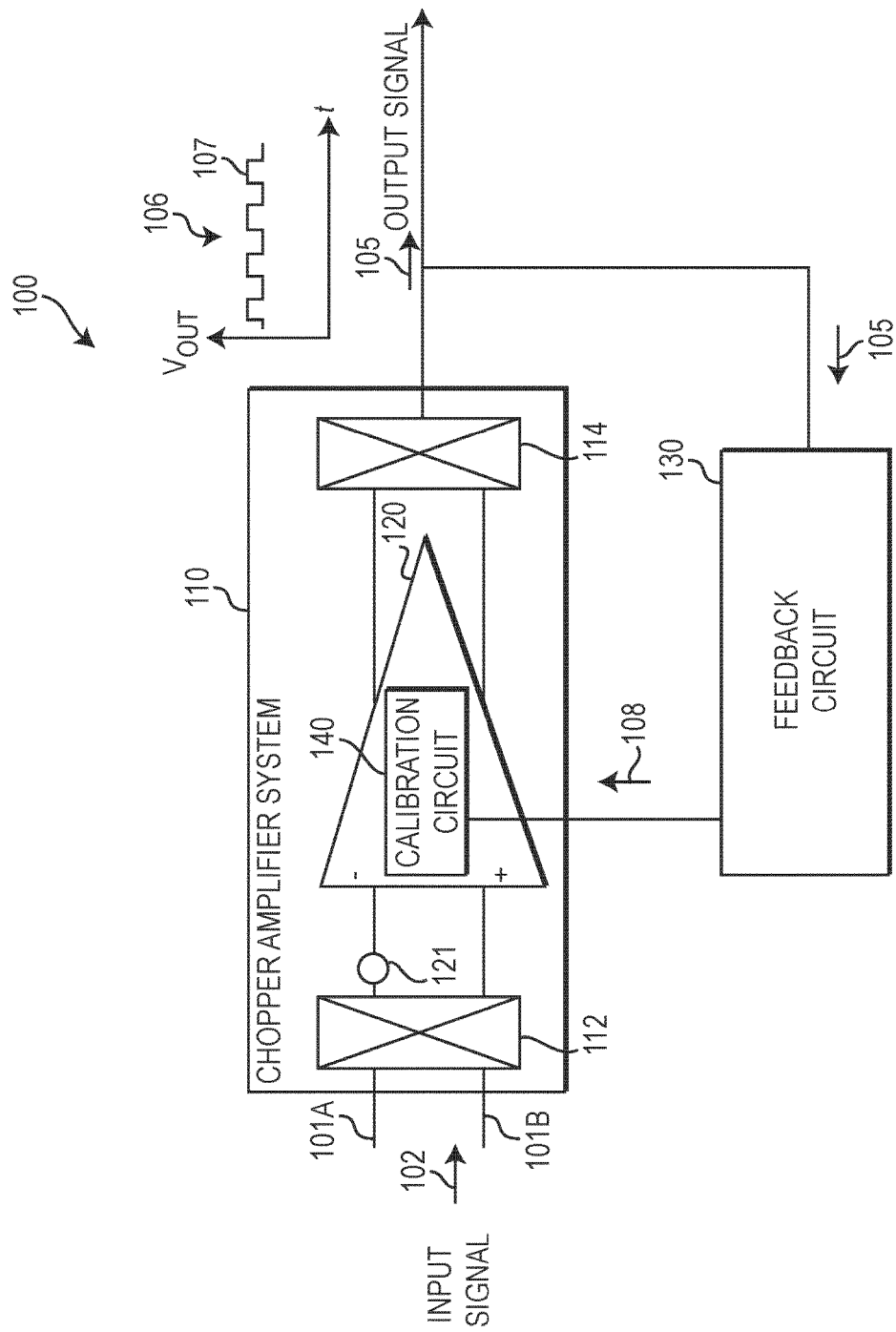
FIG. 1 shows an amplifier system according to an embodiment of the disclosure.

FIG. 1 shows an amplifier system 100 according to an embodiment of the disclosure. The amplifier system 100 includes a chopper amplifier system 110 and a feedback circuit 130. The chopper amplifier system 110 and the feedback circuit 130 are coupled together forming a feedback loop. The chopper amplifier system 110 includes a modulator 112, a differential amplifier 120, and a demodulator 114. The differential amplifier 120 includes a calibration circuit 140. These components are coupled together as shown in FIG. 1.

In an embodiment, the amplifier system 100 is configured to receive an input signal 102 and to amplify the input signal 102 to generate an output signal 105. In addition, the amplifier system 100 is configured to cancel an offset voltage of the differential amplifier 120. Specifically, due to mismatches of devices in the differential amplifier 120, an offset voltage arises in the differential amplifier 120 causing an error component in the output signal 105. With operations of the modulator 112 and the demodulator 114, the chopper amplifier system 110 generates an output signal 105 including voltage variations 107 which indicate the offset voltage. Accordingly, the feedback circuit 130 is configured to generate a control signal 108 based on the output signal 105 to adjust the calibration circuit 140 to cancel the offset voltage.

An offset voltage source 121 is coupled to an input of the differential amplifier 120 as shown in FIG. 1. The offset voltage source 121 represents an input-referred offset voltage of the differential amplifier 120. Generally, offset voltage of a differential amplifier represents an effect that when the input of the differential amplifier is set to be zero, the output of the differential amplifier is not zero. The effect, for example, is caused by mismatches of devices in the differential amplifier. The effect can be presented as output-referred offset voltage or input-referred offset voltage. Input referred voltage equals a differential voltage required between the inputs to the differential amplifier that resets the output of the differential amplifier to zero.

The effect of offset voltage can be represented using an offset voltage source for purpose of circuit analysis, while the polarity of an offset voltage source refers to the sign of a voltage generated by the offset voltage source with reference to an inverting input of the differential amplifier. The polarity of an input-referred offset voltage refers to the sign of the input-referred offset voltage with reference to an inverting input of the differential amplifier. Accordingly, the polarity of an offset voltage source is opposite to the polarity of the input-referred offset voltage.

Changes of temperature, time, and supply voltage lead to offset voltage variations that introduce errors and uncertainty into the output signal. Thus, cancellation of offset voltage is desired in various applications. In an embodiment of the disclosure, the amplifier system 100 adjusts a current in a differential pair in the differential amplifier 120 using the calibration circuit 140, for example, to compensate for offset voltage of the differential amplifier 120. The adjustment is based on information carried in an output signal 105 of the chopper amplifier system 110. This process is performed repeatedly based on the feedback loop until the offset voltage is minimized, or at least reduced to be less than an offset threshold.

In an example, the chopper amplifier system 110 is configured to receive a differential input signal 102 between two differential input terminals 101A and 101B, and amplify the input signal 102 to generate an output signal 105. In various examples, the input signal 102 can be a direct current (DC) signal or a time varying signal. During the process, the chopper amplifier system 110 is configured to first modulate the input signal 102 at the modulator 112 to a high frequency output signal. As shown, the output of the modulator 112 and the offset voltage source 121 are connected in series, thus the input signal to the differential amplifier 120 equals a sum of the high frequency output signal and the offset voltage of the offset voltage source 121. Subsequently, the differential amplifier 120 amplifies the sum of the high frequency output signal and the offset voltage to generate an amplified signal.

Thereafter, the chopper amplifier system 110 performs a demodulation operation at the demodulator 114 to generate the output signal 105. The demodulation transforms a component of the amplified signal corresponding the high frequency output signal to a low frequency signal, while at the same time, a component of the amplified signal corresponding to the offset voltage is modulated to a high frequency signal. This high frequency signal is referred to as a modulated offset voltage. As a result, the output signal 105 has a waveform 106 which includes voltage variations (a ripple) 107. In the FIG. 1 example, the waveform 106 representing the signal 105 is illustrated as a direct current signal plus the voltage variations (a high frequency component) 107. However, the output signal 105 (ignoring the voltage variations) can be a direct current signal or a time varying signal depending on one or more properties of the input signal 102 in various applications.

The voltage variations 107 correspond to components of the modulated offset voltage in the output signal 105. The peak-to-peak amplitude of the voltage variations 107 is proportional to the magnitude of the offset voltage of the differential amplifier 120 represented by the offset voltage source 121. In addition, the voltage variations 107 include information about a polarity of the offset voltage. In an example, the feedback circuit 130 performs a sensing operation on the output signal 105 to determine the polarity of the offset voltage. The sensing operation is synchronized with the modulation and demodulation operations by a clock signal (not seen). Based on the polarity of the offset voltage, the feedback circuit 130 adjusts the calibration circuit 140 in the differential amplifier 120 to reduce the offset voltage.

In a conventional offset cancellation system, an output signal 105 typically would be provided to a low-pass filter, such that the high-frequency modulated offset voltage represented by the voltage variations 107 could be filtered from the output signal, thus eliminating the offset voltage effect. However, due to the offset cancellation approach described above, a low-pass filter is not required for the amplifier system 100 to cancel an offset voltage, and information of the offset voltage carried in the output signal 105 is used by the feedback circuit 130 to dynamically adjust the differential amplifier 120 and thereby reduce the offset voltage to cancel offset.

The calibration circuit 140 is configured, in an embodiment, to adjust the differential amplifier 120 to compensate the offset voltage. In various embodiments, the calibration circuit 140 includes various types of circuits to adjust various parameters of the differential amplifier 120 in order to reduce the offset voltage. In an example, the calibration circuit 140 is configured to adjust a current at a differential pair in the differential amplifier 120 to compensate for the offset voltage under the control of the feedback circuit 130.

The feedback circuit 130 is configured to sense the output signal 105, and accordingly generate control signals 108 to adjust the calibration circuit 140, for example, to adjust a current at the differential pair in the differential amplifier 120, to compensate for the offset voltage. In an example, the feedback circuit 130 senses a difference between the amplitudes of the voltage variations 107 during different phases of a clock signal used in the modulation/demodulation process, and determines a polarity of the offset voltage accordingly. Based on the polarity of the offset voltage, the feedback circuit 130 determines how to adjust the current at the differential pair in the differential amplifier 120, for example, which side of the differential pair to increase or decrease an amount of current. Subsequently, the feedback circuit 130 generates the control signals 108 to control the calibration circuit 140 to perform the adjustment. After this adjustment, the feedback circuit 130 again senses the output signal 105 to determine the polarity of the offset voltage. If the polarity of the offset voltage does not change, the feedback circuit 130 continues to adjust the calibration circuit 140, for example, adjust the current with another amount of current. This process is repeated until the polarity of the offset voltage is reversed, and thus the offset voltage is minimized. In each iteration, the offset voltage is reduced by a portion corresponding to the amount of adjusted current.

Figure 2A:
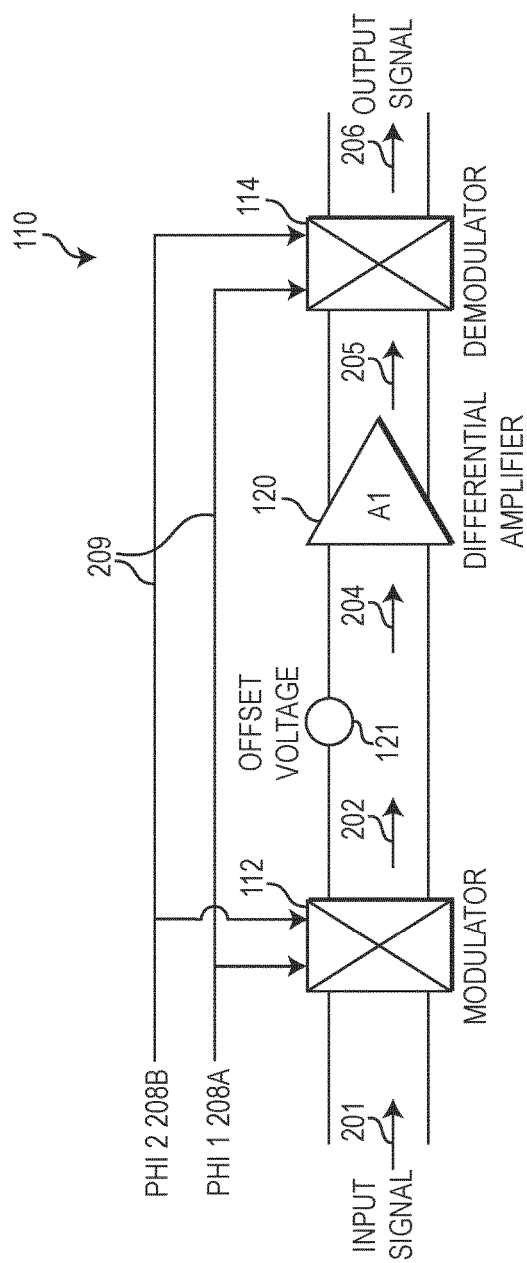
FIG. 2A shows a chopper amplifier system according to an embodiment of the disclosure.

FIG. 2A shows the chopper amplifier system 110 of FIG. 1 with greater detail, according to an embodiment of the disclosure. In one example, the modulator 112 receives an input signal 201 and a clock signal 209, modulates the input signal 201 according to the clock signal 209, and generates an output signal 202. The modulation transforms the input signal 201 from a low frequency signal 201 to the high frequency output signal 202.

Figure 2B:
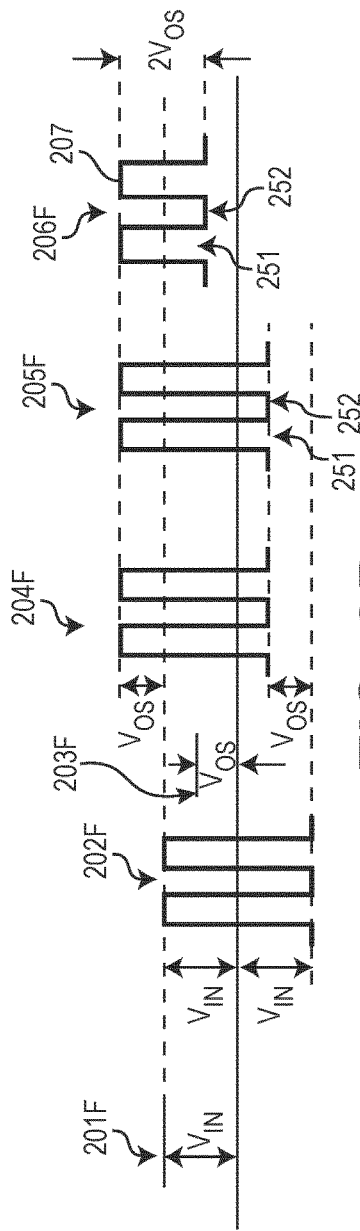
FIG. 2B shows a serial of waveforms in an example.

In an example, the clock signal 209 is a 2-phase clock signal that includes a phase 1 signal (phi1 signal) 208A, and a phase 2 signal (phi2 signal) 208B which respectively are transmitted in two separate wires. FIG. 2C shows an example of the 2-phase clock signal according to an example of the disclosure. In FIG. 2C, the phase 1 signal 208A includes a sequence of pulses forming a square wave. The square wave has a 50% duty cycle, and a constant frequency. The phase 2 signal 208B is similar to the phase 1 signal 208A in terms of waveform, duty cycle, and frequency. However, the phase 1 signal 208A and the phase 2 signal 208B are non-overlapping, and are mutually delayed by a half period from each other.

In FIG. 2C, each first half period 221 of the phase 1 signal 208A corresponding to a "1" state of the square wave is referred to as a first phase, and each second half period 222 of the phase 1 signal 208A corresponding to a "0" state of the square wave is referred to as a second phase. Thus, the time intervals 221 are a sequence of first phases, and the time intervals 222 are a sequence of second phases. In addition, during the first phases 221, the phase 2 signal has a "0" state, while during the second phases 222, the phase 2 signal has a "1" state, in an embodiment.

Figure 2D:
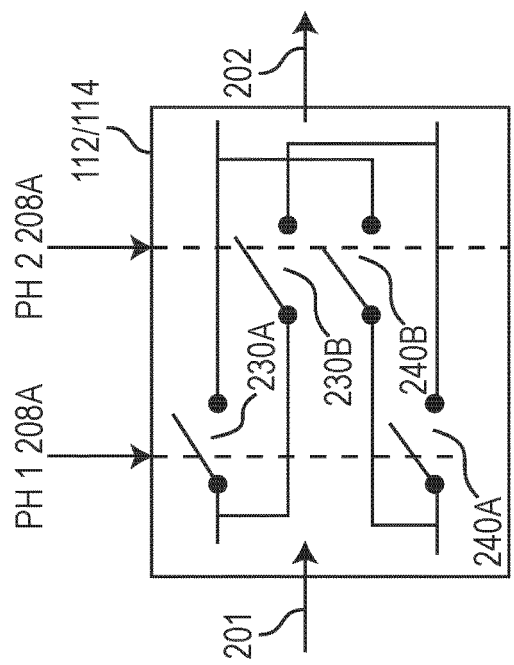
FIG. 2D shows an implementation of a modulator according to an example of the disclosure.
Figure 2C:
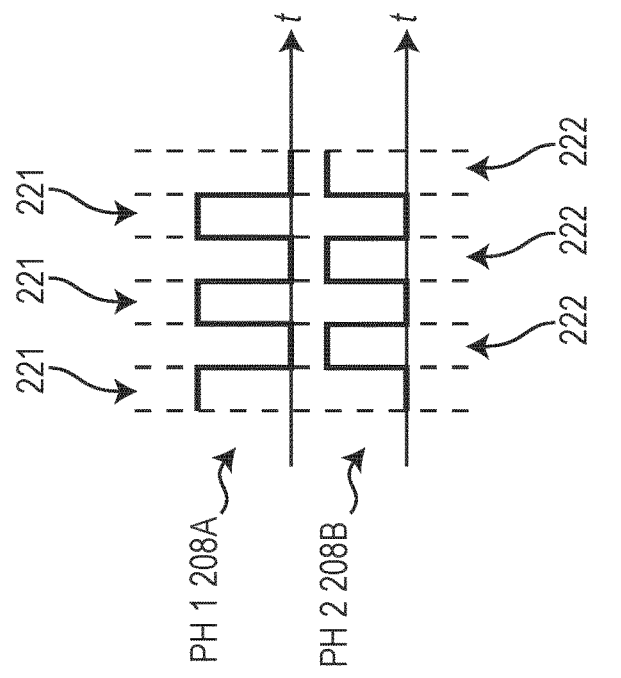
FIG. 2C shows an example of a 2-phase clock signal according to an example of the disclosure.

FIG. 2D shows an implementation of the modulator 112 according to an example embodiment. As shown, the modulator 112 includes switches 230A, 230B, 240A and 240B. The switches 230A and 240A are controlled by the phase 1 signal 208A, and the switches 230B and 240B are controlled by the phase 2 signal 208B. In operation of an embodiment, during a first phase, the switches 230A and 240A are closed such that the input signal 201 can be passed to generate the output signal 202. However, during a second phase, the switches 230B and 240B are closed such that the polarity of the input signal 201 is reversed to generate the output signal 202. In this manner, the input signal 201 is modulated to generate the "chopped" output signal 202 during the modulation operation. An example of the input signal 201 and the output signal 202 is shown in FIG. 2B where the wave forms 201F and 202F correspond to the input signal 201 and the output signal 202, respectively.

Referring back to FIG. 2A, after the modulation operation at the modulator 112, the output signal 202 generated from the modulator 112 and voltage of the offset voltage source 121 are added together to form an input signal 204 that is input to the differential amplifier 120. The differential amplifier 120 amplifies the input signal 204 including component of the offset voltage source 121 to generate an amplified signal 205 with a gain A1. The amplified signal 205 includes a first component corresponding to the signal 202 and a second component corresponding to the offset voltage represented by the offset voltage source 121. In an example, the differential amplifier 120 is an operational amplifier.

Next, the demodulator 114 receives the signal 205, along with the clock signal 209 including the phase 1 signal 208A and the phase 2 signal 208B, and demodulates the signal 205 according to the clock signal 209 to generate an output signal 206. After demodulation, the first component corresponding to the signal 202 in the amplified signal 205 is transferred from a high frequency signal to a low frequency signal, while the second component corresponding to the offset voltage in the amplified signal 205 is transformed from a low frequency signal to a high frequency signal. In an example embodiment, the demodulator 114 has functions and structures similar to the modulator 112, and is implemented using the modulator 112 in FIG. 2D.

FIG. 2B shows a serial of waveforms 201F-206F corresponding to the signals 201-202, voltage of the offset voltage source 121, and 204-206, respectively, in an example. The serial of waveforms 201F-206F demonstrates the transformation of the corresponding signals during the operation of the chopper amplifier system 110. In waveform 201F, the input signal 201 is a low frequency signal with a voltage value $V_{IN}$. After the modulation operation (chopping) at the modulator 112, the input signal 201 is transformed into a square wave 202F. Peak-to-peak amplitude of the square wave 202F is $2V_{IN}$ with a frequency equal to the clock signal 209.

As shown in waveform 203F, the offset voltage source 121 has a voltage value $V_{OS}$ with a positive polarity. The voltage of the offset voltage source 121 is added to the signal 202 to form the signal 204, forming the waveform 204F. After the amplification operation at the differential amplifier 120, the waveform 204F is magnified to the waveform 205F by a factor of A1 (the gain of the differential amplifier 120). In the FIG. 2B example, the gain takes a value A1=1. At the demodulator 114, the signal 205 is demodulated (chopped), and the waveform 205F is transformed into the waveform 206F. As shown in the waveform 206F and the waveform 205F, during a first phase 251 of the chopping operation, the amplitude of the waveform 206F is equal to that of the waveform 205F, while during a second phase 252 of the chopping operation, the amplitude of the waveform 206F is equal to that of the waveform 205F in terms of magnitude but has opposite sign. As a result, voltage variations 207 having amplitude of $2V_{OS}$ are formed.

The voltage variations 207 correspond to offset voltage of the differential amplifier 120 represented by the offset voltage source 121 that is modulated (chopped) by the demodulator 114. In addition, the voltage variations 207 carry information of polarity of the offset voltage of the differential amplifier 120. In the FIG. 2B example, the sign of voltage of the offset voltage source 121 is positive in waveform 203F, and accordingly, after the demodulation (chopping) operation, the amplitude of the voltage variations 207 in the first phase 251 is higher than in the second phase 252. On the contrary, if the sign of voltage of the offset voltage source 121 is negative, accordingly, after the demodulation (chopping) operation, the amplitude of the voltage variations 207 in the first phase 251 would be lower than in the second phase 252. Therefore, the voltage difference in the voltage variations 207 during a first phase and a second phase indicates polarity of the offset voltage source 121, and consequently polarity of the offset voltage of the differential amplifier. Thus, by comparing the amplitude of the voltage variations 207 during different phases of the clock signal 209, polarity of the offset voltage of the differential amplifier 120 is determined in an embodiment.

Figure 3:
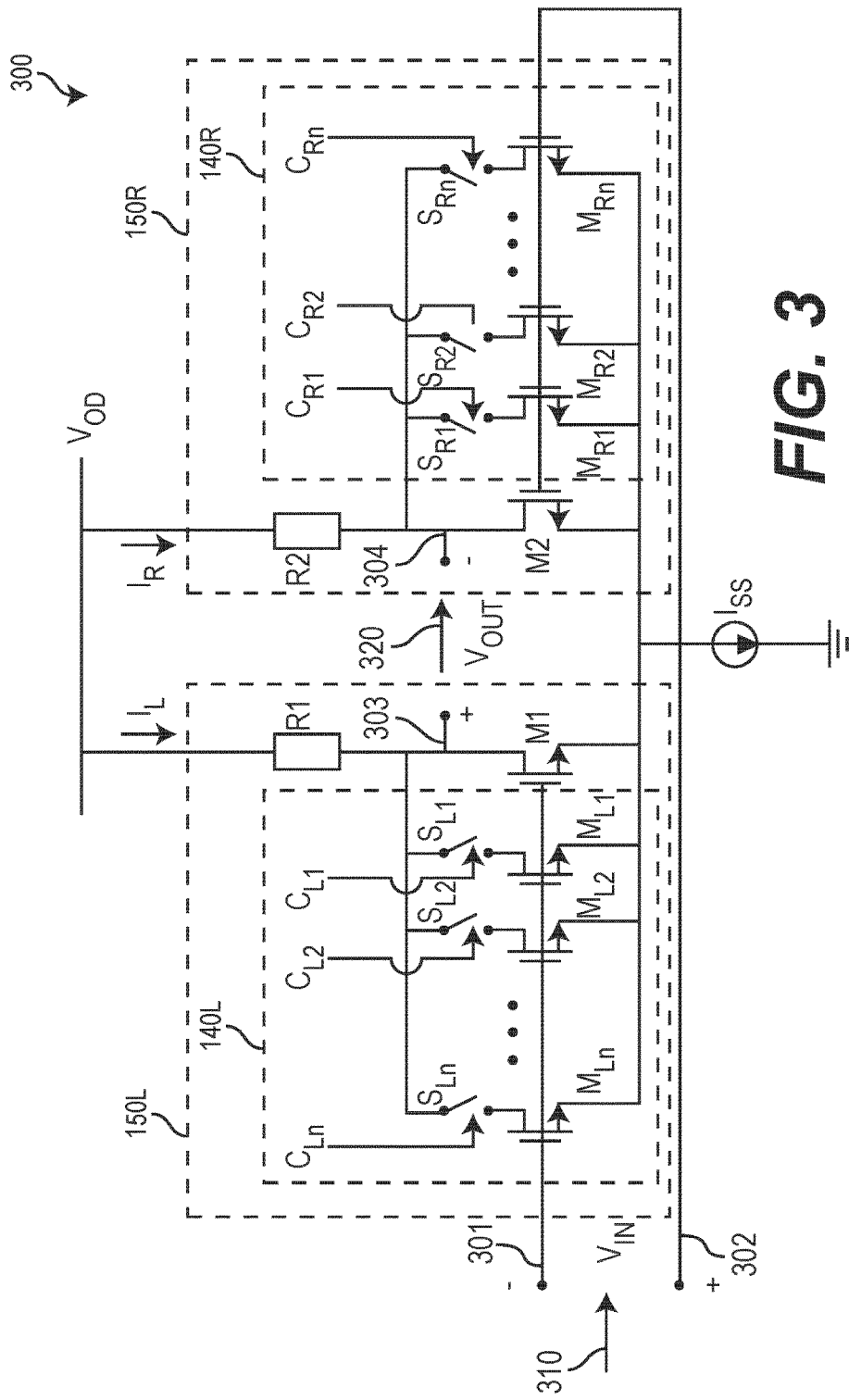
FIG. 3 shows a differential amplifier with a calibration circuit according to an embodiment of the disclosure.

FIG. 3 shows a differential amplifier 300 with the calibration circuit 140 according to an embodiment of the disclosure. The differential amplifier 300 is included in the differential amplifier 120, for example, as an input stage of the differential amplifier 120.

The differential amplifier 300 includes a differential pair that includes a left side 150L and a right side 150R. Upper end of the differential pair are coupled to a supply voltage $V_{DD}$, while lower end of the differential pair are coupled to a current source $I_{SS}$. A current $I_L$ flows through the left side 150L, while another current $I_R$ flows through the right side 150R. The differential amplifier 300 includes the calibration circuit 140 that includes a left part 140L and a right part 140R in the FIG. 3 example. In FIG. 3 example, the left side 150L of the differential pair includes the left part 140L of the calibration circuit 140, an NMOS input transistor M1, and a load resistor R1. Similarly, in the example, the right side 150R of the differential pair includes the right part 140R of the calibration circuit 140, an NMOS input transistor M2, and a load resistor R2. The devices of the differential pair 300 are coupled together as shown in FIG. 3.

In operation, while the calibration circuits 140L and 140R are not in operation, the differential pair receives a differential input signal 310 between an inverting input 301 and a non-inverting input 302 that are coupled to the gates of the input transistor M1 and the input transistor M2, and generates a differential output signal 320 between a non-inverting output 303 and an inverting output 304. Due to asymmetry of the devices, for example, R1 and R2, or M1 and M2, presented between the two sides 150L and 150R of the differential pair, an offset voltage is incurred. In an example, the output signal 320 is input to other stages of the differential amplifier 120.

In an example, the left part calibration circuit 140L includes a plurality of calibration transistors $M_{L1}$-$M_{Ln}$ each arranged parallel to the input transistor M1. In addition, gates of the plurality of calibration transistors $M_{L1}$-$M_{Ln}$ are connected to the gate of the input transistor M1, thus receiving the input signal 310 the same as the input transistor M1. Further, a switch $S_{L1}$-$S_{Ln}$ is coupled in serial to each calibration transistor $M_{L1}$-$M_{Ln}$. The switches $S_{L1}$-$S_{Ln}$ are each controlled by a control signal $C_{L1}$-$C_{Ln}$ generated from the feedback circuit 130 to switch between turned on and turned off states. The right part calibration circuit 140R has a structure similar to the left side 140L, but is controlled by another set of control signals $C_{R1}$-$C_{Rn}$ generated from the feedback circuit 130 as shown in FIG. 1. In FIG. 1, the control signals $C_{L1}$-$C_{Ln}$ and $C_{R1}$-$C_{Rn}$ are referred to as the control signals 108. In another example, the left part 140L and the right part 140R of the calibration circuit have different structures, for example, different number of calibration transistors, transistors at the two parts having different sizes, and so on.

In operation, controlled by the control signals $C_{L1}$-$C_{Ln}$ and $C_{R1}$-$C_{Rn}$, the calibration circuits 140L and 140R are adjusted to compensate for the offset voltage of the differential amplifier 120. Specifically, during operation of the differential amplifier 300, when one of switches $S_{L1}$-$S_{Ln}$ and $S_{R1}$-$S_{Rn}$ is turned on, an additional current is introduced to one side of the differential pair. The additional current affects the asymmetry of the differential pair, thus adjusting the offset voltage of the differential amplifier 300, and consequently compensating the offset voltage of the differential amplifier 120. From another perspective, turning on a switch $S_{L1}$-$S_{Ln}$ and $S_{R1}$-$S_{Rn}$ adds an additional respective transistor $M_{L1}$-$M_{Ln}$ and $M_{R1}$-$M_{Rn}$ to one of the input transistor M1 or M2, thus increasing a size of the respective input transistor M1 or M2, which compensates for the asymmetry of the differential pair 150L and 150R.

In various examples, the sizes of the calibration transistors $M_{L1}$-$M_{Ln}$ and $M_{R1}$-$M_{Rn}$ can be weighted differently. Generally, an amount of current flowing through the transistor under normal operation condition of the transistor is proportional to a width length (W/L) ratio of a transistor. By configuring different calibration transistors $M_{L1}$-$M_{Ln}$ and $M_{R1}$-$M_{Rn}$ with different W/L ratio, each calibration transistor provides different amount of additional current when switched on. In one example, the calibration transistors $M_{L1}$-$M_{Ln}$ and $M_{R1}$-$M_{Rn}$ in each part of the calibration circuits 140L and 140R are equally weighted. For example, the W/L ratio of each of the transistors $M_{L1}$-$M_{Ln}$ are configured to equal to 2/1. In another example, the calibration transistors $M_{L1}$-$M_{Ln}$ and $M_{R1}$-$M_{Rn}$ in each part of the calibration circuits 140L and 140R are binary-weighted. For example, the W/L ration of the transistors $M_{L1}$-$M_{Ln}$ are configured to be 1, 2, 4, 8, 16, and so on.

It is noted that in various embodiments the calibration circuits 140L and 140R are suitably employed in other differential amplifier circuits that have structures different from the amplifier 300, such as cascode, or cascode folded structure, or uses different type of devices, such as PMOS transistors or bipolar transistors (accordingly, the calibration circuits 140L and 140R can be adapted to use the same type devices). In addition, active loads, such as a current source can be used instead of the load transistors R1 and R2 in the other differential circuits.

Figure 4:
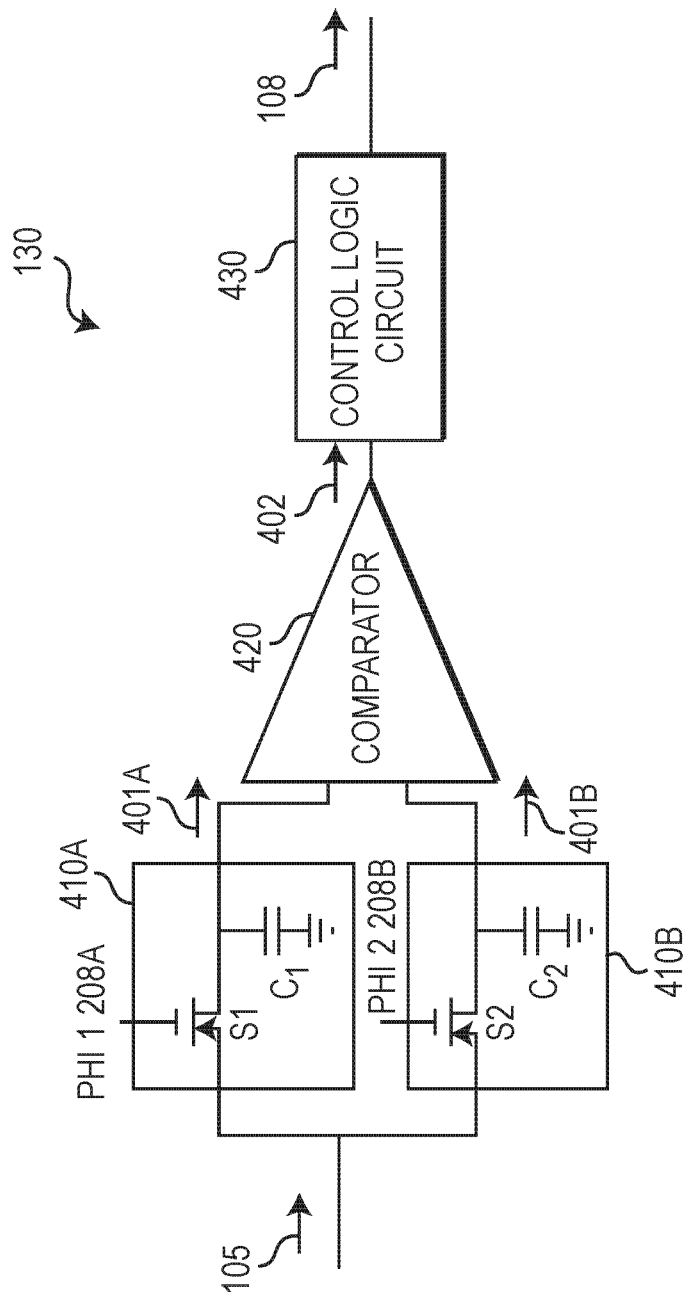
FIG. 4 shows a feedback circuit according to an embodiment of the disclosure.

FIG. 4 shows an example of the feedback circuit 130 of FIG. 1 according to an embodiment of the disclosure. The feedback circuit 130 includes a first sample and hold (S/H) circuit 410A, a second S/H circuit 410B, a comparator 420, and a control logic circuit 430.

In an example, the first S/H circuit 410A samples the output signal 105 in the FIG. 1 example during a first phase, and outputs a signal 401A representing a first voltage corresponding to a first amplitude of the voltage variations 107 during the first phase. The second S/H circuit 410B samples the output signal 105 in the FIG. 1 example during a second phase, and outputs a signal 401B representing a second voltage corresponding to a second amplitude of the voltage variations 107 during the second phase.

In an example, the first S/H circuit 410A includes a PMOS transistor S1, and a capacitor C1. The transistor S1 is controlled by the phase 1 clock signal 208A, and operated as a switch. When the phase 1 clock signal 208A is at a low level during a second phase 222 as shown in FIG. 2C, the transistor S1 is turned on. Thus, during a second phase when the transistor S1 is turned on, and the capacitor C1 is charged until a voltage drop on the capacitor C1 is equal to the voltage of the input signal 105. At the beginning of a consecutive first phase 221, the transistor S1 is turned off, and the voltage equal to the voltage of the input signal 105 during the first phase is held at the capacitor C1 and output as the signal 401A. In the example, the second S/H circuit 410B has a structure similar to the first S/H circuit, and operates similarly.

In one example, the comparator 420 receives the signals 401A and 401B, and generates an output signal 402 based on which of the signals 401A and 401B has a higher voltage value. For example, when the signal 401A has a higher voltage value, the comparator 420 outputs a signal has a "1" state. On the contrary, the signal 401B has a higher voltage value, the comparator 420 outputs a signal has a "0" state. As explained in the FIG. 2B example, voltage levels of the voltage variations during a first phase and a second phase indicate a polarity of the offset voltage of the differential amplifier 120. Thus, the output signal 402 indicates the polarity of the offset voltage of the differential amplifier 120. Consequently, the polarity of the offset voltage of the differential amplifier 120 is determined based on operations of the two S/H circuits 410A and 410B, and the comparator 420.

In one example, the control logic circuit 430 receives the output signal 402 of the comparator 420, and generates control signals 108 (referred to as control signals $C_{L1}$-$C_{Ln}$ and $C_{R1}$-$C_{Rn}$ in the FIG. 3 example) to adjust the calibration circuit 140. In an example, based on the polarity of the offset voltage, the control logic circuit 430 first determines which side of the calibration circuit is to be adjusted, and accordingly whether to increase or decrease a current, $I_R$ or $I_L$ in FIG. 3 example. In one example, the determination is based on a configuration. The configuration, for example, defines that reducing a current of one side of the differential pair is preferred than increasing a current. Accordingly, the control logic circuit 430 first selects a side of the calibration circuit 140 to decrease a current. If at the selected side, all switches of the calibration circuit 140 have been turned off and no room exists for reducing the current, the control logic circuit 430 then selects the other side of the calibration circuit 140 to increase a current.

Second, the control logic circuit 430 generates control signals $C_{L1}$-$C_{Ln}$ and $C_{R1}$-$C_{Rn}$ to operate the calibration circuits 140L or 140R. In one embodiment, the differential amplifier 120 is calibrated during an initial calibration process to cancel the offset voltage. As a result of the initial calibration, part of the switches $S_{L1}$-$S_{Ln}$ and $S_{R1}$-$S_{Rn}$ are turned on, and part are turned off. After the initial calibration, the amplifier system 100 starts to operate. During the operation, the feedback circuit 130 generates control signals 108 to change states of the switches $S_{L1}$-$S_{Ln}$ and $S_{R1}$-$S_{Rn}$ (turn on or turn off the switches).

In one example, calibration transistors $M_{L1}$-$M_{Ln}$ and $M_{R1}$-$M_{Rn}$ in the calibration circuits 140L or 140R are equally weighted. Accordingly, the control logic circuit 430 generates a control signal to turn on or turn off a switch to increase or decrease a current of one side of the differential pair. In another example, calibration transistors $M_{L1}$-$M_{Ln}$ and $M_{R1}$-$M_{Rn}$ in the calibration circuits 140L or 140R are binary-weighted. Accordingly, the control logic circuit 430 generates one or more control signals to turn on or turn off one or more switches to increase or decrease a current.

Figure 5:
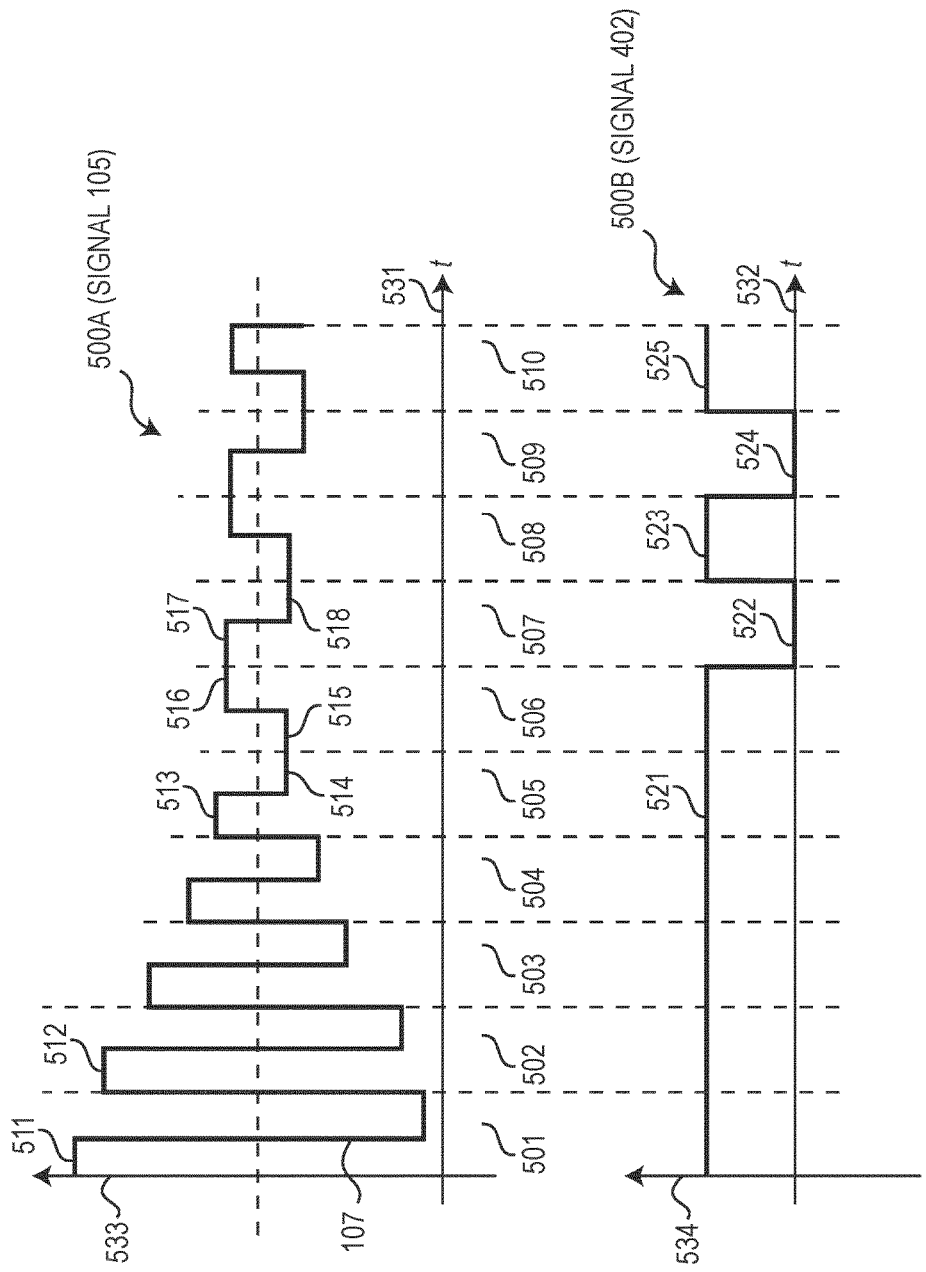
FIG. 5 shows a first waveform illustrating an output signal of a chopper amplifier system, and a second waveform illustrating an output signal of a comparator according to an embodiment of the disclosure.

FIG. 5 shows a first waveform 500A corresponding to an output signal 105 of the chopper amplifier system 110 in FIG. 1, and a second waveform 500B corresponding to an output signal 402 of the comparator 420 in FIG. 4 according to an embodiment of the disclosure. Horizontal axes 531 and 532 represent time, and respectively include a plurality of time intervals 501 to 510. Each time interval corresponds to a period of the phase 1 clock signal or the phase 2 clock signal in the FIG. 1 example. Vertical axes 533 and 534 represent an amplitude of the voltage variations 107 in FIG. 1, and an amplitude of the output signal 402 from the comparator 420, respectively. FIG. 5 illustrates changes of the output signals 105 and 402 during an offset cancellation process in an example.

As shown, at the beginning of the process, due to a temperature or supply voltage variation, an offset voltage of the differential amplifier 120 in FIG. 1 is introduced. As a result, voltage variations 107 start to appear during time interval 501, and have an amplitude 511. The feedback circuit 130 senses the output signal 105 during time interval 501, and the comparator 420 generates the output signal 402 at the beginning of time interval 502. The generated output signal 402 has an amplitude 521. The amplitude 521 indicates the current polarity of the offset voltage.

Based on the current polarity of the offset voltage, the feedback circuit 130 generates one or more control signals 108 at the beginning of time interval 502 to adjust a current at one side of the differential pair in FIG. 3. This adjustment reduces the offset voltage by a certain amount causing the voltage variations 107 in waveform 500A being reduced from amplitude 511 to amplitude 512. However, the adjustment does not make the offset voltage to be zero. Thus, during time interval 502, the feedback circuit 130 continues to sense the output signal 105, and generates control signals 108 at the end of time period 502 to adjust a current. The above operation is repeated until the end of time interval 505.

Before the end of time interval 505, the amplitude of the voltage variations decreases gradually from amplitude 511 to amplitude 513. However, polarity of the offset voltage maintains the same. Thus amplitude of the signal 402 does not change before the end of time interval 505.

At the end of time interval 505, the feedback circuit 130 generates control signals 108 to calibrate the calibration circuit 140. As a result of the calibration, the polarity of the offset voltage is reversed at the beginning of time interval 506. As shown in waveform 500A, during time interval 505, the amplitude 513 during the first phase is higher than the amplitude 514 during the second phase. However, during time interval 506, the amplitude 515 during the first phase is higher than the amplitude 516. Accordingly, as shown in waveform 500B, the output signal 402 of the comparator 420 maintains an amplitude 521 during time interval 506 indicating polarity of the offset voltage during time interval 505, but changes to amplitude 522 during time interval 507 reflecting polarity of the offset voltage during time interval 506.

At the beginning of time interval 507, based on the polarity during time interval 506, the feedback circuit 130 adjusts the calibration circuit 140, and consequently, the polarity of the offset voltage is reversed again. As shown, the amplitude of the voltage variations 107 changes from amplitudes 515 and 516 to amplitudes 517 and 518, corresponding to the first phase and the second phase. Thereafter, the polarity of the offset voltage keeps changing as shown in waveform 500B where the amplitude of the signal 402 changes to be amplitudes 523, 524 and 525, successively.

Figure 6:
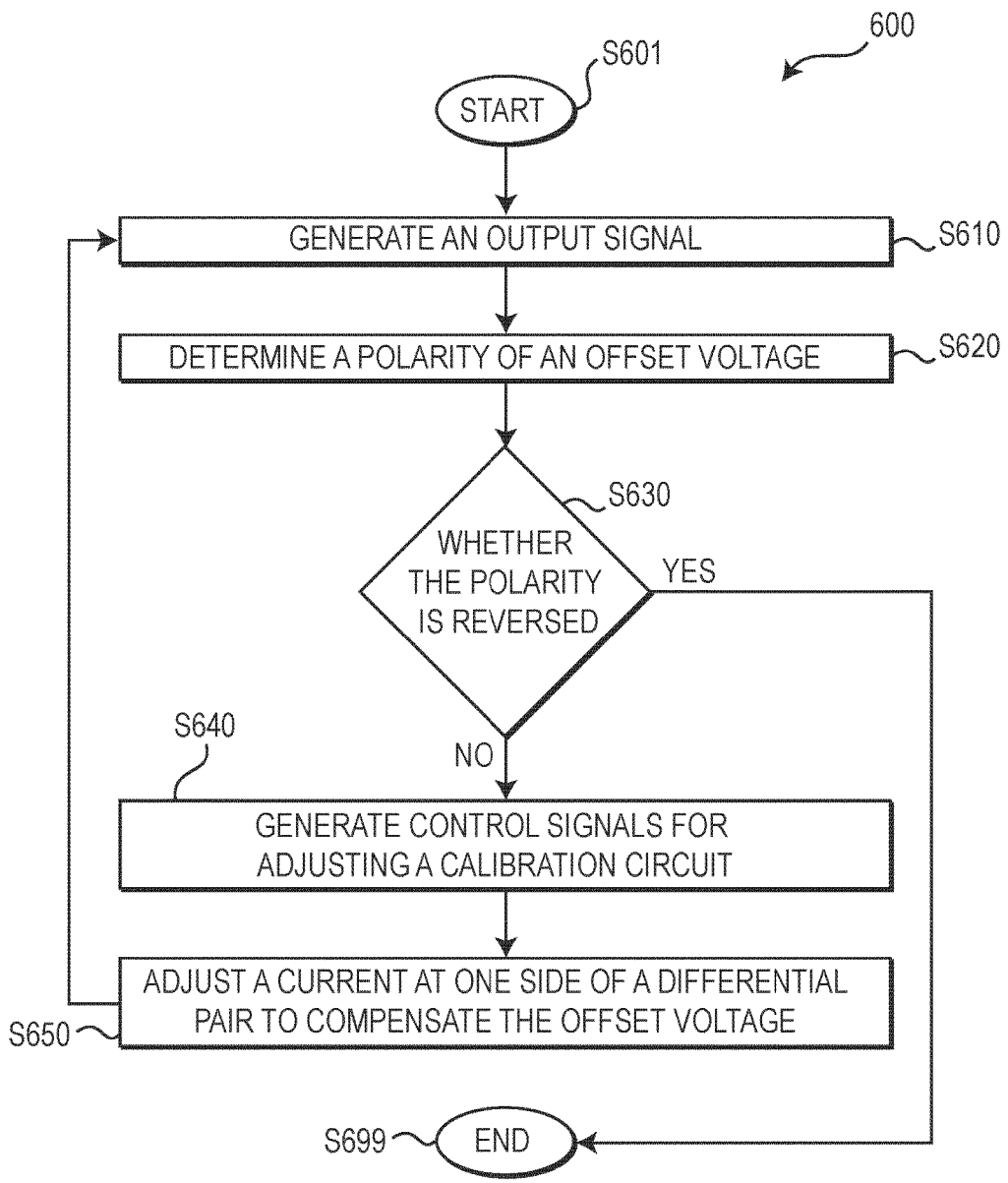
FIG. 6 shows a process for cancelling an offset voltage in a differential amplifier according to an embodiment of the disclosure.

FIG. 6 shows a process 600 for cancelling an offset voltage in a differential amplifier according to an embodiment of the disclosure. The process 600 starts at S601, and proceeds to S610.

At S610, an output signal including voltage variations indicating polarity of an offset voltage is generated at a chopper amplifier.

At S620, the polarity of the offset voltage is determined. For example, amplitude of the voltage variations is sampled at a first phase and a second phase of a clock signal to generate two sampled amplitudes. Then, the two sampled amplitudes are compared to generate a signal indicating polarity of the offset voltage.

At S630, whether the polarity of the offset voltage is reversed is determined.

When the polarity is not reversed, the process 600 proceeds to S640. Otherwise, the process 600 proceeds to S699, and terminates at S699.

At S640, control signals are generated for adjusting a calibration circuit in the chopper amplifier. The control signals are transmitted to the calibration circuit.

At S650, a current at one side of the differential pair is adjusted to compensate the offset voltage. Specifically, the control signals generated at S640 controls switches in the calibration circuit to remove a portion of the current or add an additional current to the current to compensate the offset voltage. The process 600 then proceeds to S610, and repeats from S610.

It is noted that in some embodiments the process 600 is continuously repeated to compensate for offset voltages incurred by varying operating conditions.

Figure 7:
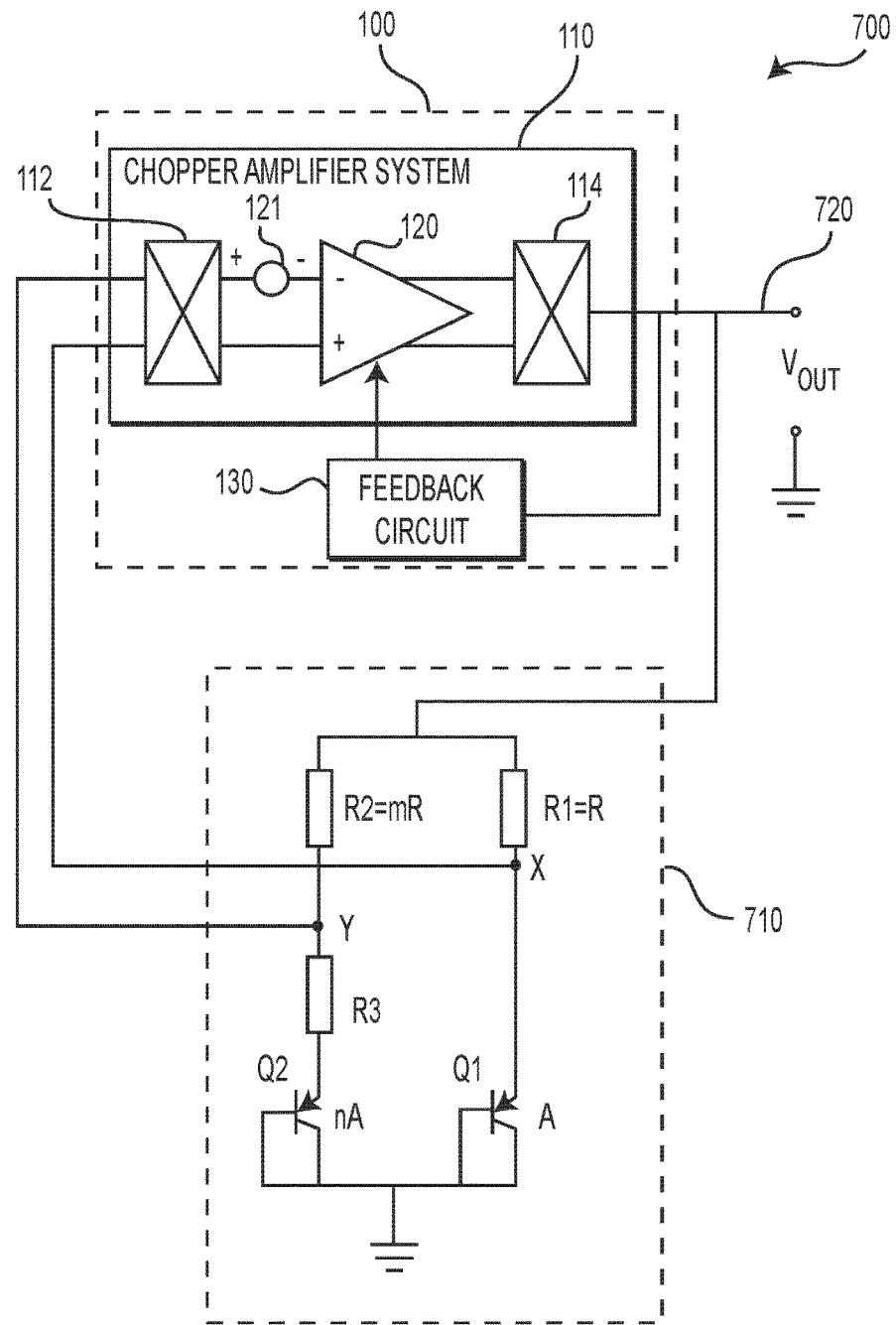
FIG. 7 shows a bandgap reference circuit according to an embodiment of the disclosure.

FIG. 7 shows a bandgap reference circuit 700 according to an embodiment of the disclosure. The bandgap reference circuit 700 generates a reference voltage $V_{OUT}$ at an output terminal 720. The reference voltage $V_{OUT}$ has a temperature coefficient (TC) approximate to zero.

As shown, in an embodiment, the circuit 700 includes the amplifier system 100 and a bandgap core circuit 710. The amplifier system 100 includes the chopper amplifier system 110 and the feedback circuit 130. The chopper amplifier system 110 includes the modulator 112, the differential amplifier 120, and the demodulator 114. The differential amplifier 120 includes the calibration circuit 140 (not shown), and has a large gain A1. The offset voltage source 121 is coupled to the inverting input of the differential amplifier 120, and has a voltage $V_{OS}$ representing the offset voltage effect. In operation of an example, the amplifier system 100 continuously monitors voltage variations in the reference voltage $V_{OUT}$, and compensates offset voltage of the differential amplifier 120, such that the voltage $V_{OS}$ is minimized.

In an example, the bandgap core circuit 710 includes a right branch and a left branch. The right branch includes a first resistor R1 having a resistance of R, and a first bipolar transistor Q1 that consist of a unit transistor. The left branch include a second resistor R1 having a resistance of mR, a third resistor R3. The left branch also includes a second bipolar transistor Q2 that consists of n unit transistors in parallel. The upper ends of the right and left branch are connected to the output terminal 720. The base terminals and collector terminals of the two transistors Q2 and Q1 are connected to the ground.

In addition, point X between transistors R2 and R3 is connected to inverting input of the differential amplifier 120 via the modulator 112 and the offset voltage source 121. While point X between resistor R1 and transistor Q1 is connected to the non-inverting terminal of the differential amplifier 120 via the modulator 112. Currents flowing through the right branch and left branch are represented with I1 and I2, respectively.

Assuming the modulator 112, and the demodulator 114 pauses their modulation/demodulation operation, the reference voltage $V_{OUT}$ is derived as follows. First, due to the large gain A1, the inverting input and non-inverting input are driven to be approximately equal, thus $$V_{BE1} = V_{BE2} + R3 \cdot I2 - Vos, \quad (1)$$

where $V_{BE1}$, $V_{BE2}$ are base-emitter voltages of transistors Q1 and Q2 respectively. Accordingly, $$I2 = (V_{BE1} - V_{BE2} + Vos)/R3. \quad (2)$$

Then, based on the voltage drop on the left branch, the reference voltage $V_{OUT}$ is expressed as, $$V_{OUT} = V_{BE2} + I2 \cdot (R2 + R3) = V_{BE2} + (1 + R2/R3)(V_{BE1} - V_{BE2}) + (1 + R2/R3)V_{OS}. \quad (3)$$

It is known that $V_{BE1} - V_{BE2} = V_T \ln(m \cdot n)$, where $V_T$ is the thermal voltage. Thus, $$V_{OUT} = V_{BE2} + (1 + R2/R3)V_T \ln(m \cdot n) + (1 + R2/R3)V_{OS}. \quad (4)$$

It is noted that the base-emitter voltage $V_{BE2}$ has a negative TC, while $V_T$ has a positive TC. By suitably choosing parameter values of R2, R3, m, and n, a well-defined reference voltage $V_{BE2} + (1 + R2/R3) V_T \ln(m \cdot n)$ having a zero TC can be obtained. However, the voltage $V_{OS}$ varies with temperature, raising the TC of the reference voltage $V_{OUT}$.

According to one aspect of the disclosure, in one example, the amplifier 110 continuously performs offset voltage cancellation operation, causing the voltage $V_{OS}$ to be a minimized value. As a result, a bandgap reference $V_{OUT}$ having a TC approximate to zero can be obtained.

It is noted that, in some embodiments, the calibration circuit 140 in chopper amplifier system 110 is adjusted to compensate for offset caused by other circuit elements other than the differential amplifier 120. In other words, usage of the calibration circuit 140 is not limited to the offset cancellation scheme described above. In one example, in the bandgap reference circuit 700, the calibration circuit 140 located in the differential amplifier 120 is used to compensate for the offset caused by various mismatches in the entire bandgap reference circuit 700, such as mismatches inside the differential amplifier 120, mismatch between bipolar pairs Q1 and Q2, mismatch between resistors R2 and R1, and so on. In this scenario, control signals for adjusting the calibration circuit 140 are generated from other elements other than the feedback circuit 130 in an embodiment.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An amplifier system, comprising:
a modulator configured to perform a chopping process at a chopping frequency to modulate an input signal and generate a modulated signal;
a differential amplifier having an offset voltage, the differential amplifier configured to amplify the modulated signal to generate an amplified signal, the amplified signal having an amplified offset voltage corresponding to the offset voltage;
a demodulator configured to demodulate, at the chopping frequency, the amplified signal to generate an output signal having voltage variations that are indicative of the offset voltage of the differential amplifier, and that vary at the chopping frequency; and a feedback circuit configured to determine a polarity of the offset voltage of the differential amplifier based on the output signal and to transmit a control signal to an offset calibration circuit in the differential amplifier to reduce the offset voltage of the differential amplifier based on the polarity of the offset voltage.

2. The amplifier system of claim 1, wherein the offset calibration circuit includes:
   a first group of calibration transistors respectively arranged parallel to a first input transistor of a differential pair in the differential amplifier; and
   a second group of calibration transistors respectively arranged parallel to a second input transistor of the differential pair in the differential amplifier;
   wherein respective calibration transistors are serially connected with a switch controlled by one of the control signal of the feedback circuit, and ones of the calibration transistors allow an additional current at one side of the differential pair when the corresponding switch is turned on by the control signal.

3. The amplifier system of claim 2, wherein width length ratios (W/L) of the calibration transistors in respective groups have equal values or binary weighted values.

4. The amplifier system of claim 2, wherein the feedback circuit includes a control logic circuit configured to generate the control signal to control the offset calibration circuit and to compensate for the offset voltage of the differential amplifier.

5. The amplifier system of claim 4, wherein the control logic circuit is configured to generate the control signal to adjust a current at one side of the differential pair in the differential amplifier according to the polarity of the offset voltage.

6. The amplifier system of claim 5, wherein the control logic circuit is configured to generate the control signal to control the offset calibration circuit to adjust a current at one side of the differential pair in the differential amplifier according to the polarity of the offset voltage to compensate for the offset voltage of the differential amplifier until the polarity of the offset voltage is reversed.

7. The amplifier system of claim 1, wherein the feedback circuit includes a sensing circuit configured to sample the output signal and to generate a signal indicating the polarity of the offset voltage of the differential amplifier.

8. The amplifier system of claim 7, wherein the sensing circuit includes:
   a first sample and hold circuit configured to sample the output signal during a first phase of a clock signal and to generate a first voltage; and
   a second sample and hold circuit configured to sample the output signal during a second phase of the clock signal and to generate a second voltage, wherein the clock signal has a frequency equal to the chopping frequency.

9. The amplifier system of claim 8, wherein the sensing circuit further includes:
   a comparator configured to compare the first voltage and the second voltage and to generate the signal indicating the polarity of an offset voltage of the differential amplifier.

10. A method for modifying cancelling an offset voltage of a differential amplifier, comprising:
    performing a chopping process at a chopping frequency to modulate an input signal and generate a modulated signal;
    amplifying, by the differential amplifier, the modulated signal to generate an amplified signal having an amplified offset voltage corresponding to the offset voltage;
    demodulating, at the chopping frequency, the amplified signal to generate an output signal having voltage variations that is indicative of the offset voltage of the differential amplifier, and that vary at the chopping process;
    determining a polarity of the offset voltage of the differential amplifier based on the output signal; and
    transmitting a control signal to an offset calibration circuit to reduce the offset voltage of the differential amplifier based on the polarity of the offset voltage.

11. The method of claim 10, further comprising:
    adjusting a current at one side of a differential pair of the differential amplifier to compensate for the offset voltage of the differential amplifier.

12. The method of claim 11, wherein adjusting a current at one side of a differential pair of the differential amplifier includes:
    turning on or off a switch connected with one of a group of calibration transistors of the offset calibration circuit to increase or decrease a current at one side of the differential pair of the differential amplifier, the group of calibration transistors being respectively arranged parallel to an input transistor of the differential pair of the differential amplifier.

13. The method of claim 12, wherein width length ratios (W/L) of the group of calibration transistors have equal values or binary weighted values.

14. The method of claim 10, further comprising:
    determining whether the polarity of the offset voltage is reversed; and
    when the polarity of the offset voltage is not reversed, repeating transmitting the control signal to the offset calibration circuit, generating the output signal including the voltage variations, and determining the polarity of the offset voltage.

15. The method of claim 10, wherein determining the polarity of the offset voltage of the differential amplifier based on the output signal includes:
    sampling the output signal during a first phase of a clock signal to generate a first voltage; and
    sampling the output signal during a second phase of the clock signal to generate a second voltage.

16. The method of claim 15, wherein determining the polarity of the offset voltage of the differential amplifier based on the output signal further includes:
    comparing the first voltage and the second voltage to generate the signal indicating the polarity of the offset voltage of the differential amplifier.

* * * * *